US011993405B2

(12) United States Patent
Jankovic et al.

(10) Patent No.: US 11,993,405 B2
(45) Date of Patent: May 28, 2024

(54) THERMAL CONTROL MATERIAL

(71) Applicants: Vladan Jankovic, Santa Monica, CA (US); Philip W. C. Hon, Hawthorne, CA (US); Luke A. Sweatlock, Hawthorne, CA (US); Michael T. Barako, Gettysburg, PA (US); Mark William Knight, El Segundo, CA (US); Shao-Hua Wu, Taichung (TW); Michelle L. Povinelli, Los Angeles, CA (US); Ahmed M. Morsy, Carbondale, IL (US); Mingkun Chen, Palo Alto, CA (US)

(72) Inventors: Vladan Jankovic, Santa Monica, CA (US); Philip W. C. Hon, Hawthorne, CA (US); Luke A. Sweatlock, Hawthorne, CA (US); Michael T. Barako, Gettysburg, PA (US); Mark William Knight, El Segundo, CA (US); Shao-Hua Wu, Taichung (TW); Michelle L. Povinelli, Los Angeles, CA (US); Ahmed M. Morsy, Carbondale, IL (US); Mingkun Chen, Palo Alto, CA (US)

(73) Assignees: NORTHROP GRUMMAN SYSTEMS CORPORATION, Falls Church, VA (US); UNIVERSITY OF SOUTHERN CALIFORNIA, Los Angeles, CA (US)

( * ) Notice: Subject to any disclaimer, the term of this patent is extended or adjusted under 35 U.S.C. 154(b) by 1238 days.

(21) Appl. No.: 16/594,648

(22) Filed: Oct. 7, 2019

(65) Prior Publication Data

US 2020/0269999 A1      Aug. 27, 2020

Related U.S. Application Data

(60) Provisional application No. 62/809,250, filed on Feb. 22, 2019.

(51) Int. Cl.
F28F 21/00 (2006.01)
B32B 3/30 (2006.01)
(Continued)

(52) U.S. Cl.
CPC .................. B64G 1/50 (2013.01); B32B 3/30 (2013.01); B64G 1/226 (2013.01); B64G 1/503 (2013.01);
(Continued)

(58) Field of Classification Search
CPC . B64G 1/50; B64G 1/503; B64G 1/58; B64G 1/226; H10N 70/231;
(Continued)

(56) References Cited

U.S. PATENT DOCUMENTS 4,283,113 A    8/1981  Eden
7,035,498 B2   4/2006  Wu et al.
(Continued)

FOREIGN PATENT DOCUMENTS

CN      109095499 A    12/2018
EP      0699921 A2     3/1996

OTHER PUBLICATIONS

Shao-Hua Wu, et al., "Thermal Homeostasis Using Microstructured Phase-Change Materials", OPTICA, vol. 4, No. 11, Nov. 8, 2017, p. 1390-1395.*
(Continued)

Primary Examiner — Tye William Abell
(74) Attorney, Agent, or Firm — Tarolli, Sundheim, Covell & Tummino LLP

(57) ABSTRACT

Systems and methods are provided for protecting a temperature sensitive object. A system includes a temperature sensitive object and a thermal control material in thermal communication with the temperature sensitive object. The thermal control material has an emissivity that varies as a
(Continued)

function of temperature, and includes a substrate comprising a first surface comprising one of a photonic crystal, a metamaterial, a metasurface, and a multilayer film, a solid state phase change material in contact with the surface, and a reflective thin film material at one of a second surface of the substrate, at a surface of the solid state phase change material, and on an opposite side of an optical cavity from the substrate.

20 Claims, 3 Drawing Sheets

(51) Int. Cl.
    B64G 1/22      (2006.01)
    B64G 1/50      (2006.01)
    B64G 1/58      (2006.01)
    C01G 31/02     (2006.01)
    C09K 5/14      (2006.01)
    G02F 1/01      (2006.01)
    H10N 70/00     (2023.01)
    H10N 70/20     (2023.01)

(52) U.S. Cl.
    CPC ............... B64G 1/58 (2013.01); C01G 31/02 (2013.01); C09K 5/14 (2013.01); F28F 21/00 (2013.01); G02F 1/0147 (2013.01); H10N 70/231 (2023.02); H10N 70/8613 (2023.02); H10N 70/882 (2023.02); H10N 70/8828 (2023.02); G02F 2202/30 (2013.01); G02F 2202/32 (2013.01)

(58) Field of Classification Search
    CPC ........... H10N 70/8828; H10N 70/8613; H10N 70/882; B32B 3/30; C01G 31/02; C09K 5/14; F28F 21/00; G02F 1/0147; G02F 2202/30; G02F 2202/32
    See application file for complete search history.

(56) References Cited

U.S. PATENT DOCUMENTS

| 7,443,902 | B2 | 10/2008 | Scherer |
| 2002/0130312 | A1 | 9/2002 | Yu et al. |
| 2006/0043541 | A1 | 3/2006 | Tetelbaum |
| 2006/0159132 | A1 | 7/2006 | Young et al. |
| 2008/0291948 | A1 | 11/2008 | McCarthy et al. |
| 2011/0111147 | A1 | 5/2011 | Agrawal et al. |
| 2011/0175061 | A1 | 7/2011 | Berkley et al. |
| 2011/0243158 | A1 | 10/2011 | Spiekermann et al. |
| 2017/0297750 | A1* | 10/2017 | Liu ........................ B64G 1/503 |
| 2018/0334269 | A1* | 11/2018 | Yoshimoto .............. F28F 21/00 |

OTHER PUBLICATIONS

Brent L. Danner, et al., "Characterizing Metal-Insulator-Transition (MIT) Phase Change Materials (PCM) for RF and DC Micro-Switching Elements", Procedia Engineering, vol. 47, Jan. 1, 2012, pp. 80-83.*

International Search Report and Written Opinion for International Application No. PCT/US2019/055011 dated Jan. 9, 2020.

Shao-Hua Wu, et al., "Thermal homeostasis using microstructured phase-change materials", OPTICA, vol. 4, No. 11, Nov. 8, 2017, p. 1390, XP055653822, DOI: 10.1367/OPTICA.4.001390, figures 2, 3, 5.

Brent L. Danner, et al., "Characterizing Metal-Insulator-Transition (MIT) Phase Change Materials (PCM) for RF and DC Micro-switching Elements", Procedia Engineering, vol. 47, Jan. 1, 2012, pp. 80-83, XP055654077, Amsterdam, NL, ISSN: 1877-7058, DOI: 10.1016/j.proeng.2012.09.089, abstract.

Non Final Office Action for U.S. Appl. No. 16/554,089 dated Dec. 16, 2020.

* cited by examiner

THERMAL CONTROL MATERIAL

RELATED APPLICATIONS

This application claims priority from U.S. Provisional Application No. 62/809,250, filed 22 Feb. 2019, the subject matter of which is incorporated herein by reference in its entirety.

TECHNICAL FIELD

This invention relates to optical and thermal systems, and more particularly, to a thermal control material.

BACKGROUND

Thermal control is important in environments such as space, where changing solar illumination causes large temperature variation, for example, between one hundred fifty kelvin and four hundred kelvin, and the absence of convection makes radiative emission the sole cooling mechanism. Various systems have been used to mitigate temperature fluctuations, including approaches based on mechanically-moving parts, such as mechanical shutters, or fluid-filled heat pipes; however, they tend to be bulky and require power.

Radiators that emit significantly more when hot than when cold can be designed to dampen temperature fluctuations arising from changes in solar illumination and from on-board hear generation. Micro-patterned thermal radiator advanced designs have been able to achieve near-unity infrared (IR) emissivity and passive, steady-state radiative cooling. To provide temperature regulation, however, switchable emissivity is required so that the thermal radiator can be designed to have stronger thermal radiative emission when heated and weaker thermal radiative emission when cooled.

SUMMARY OF THE INVENTION

In one example, a system includes a temperature sensitive object and a thermal control material in thermal communication with the temperature sensitive object. The thermal control material has an emissivity that varies as a function of temperature, and includes a substrate comprising a first surface comprising one of a photonic crystal, a metamaterial, a metasurface, and a multilayer film, a solid state phase change material in contact with the surface, and a reflective thin film material at one of a second surface of the substrate, at a surface of the solid state phase change material, and on an opposite side of an optical cavity from the substrate.

In another example, a method provides a thermal control material having high emissivity within a wavelength range of interest. One of a photonic crystal, a metamaterial, a metasurface, and a multilayer film is fabricated on a first surface of a substrate. A layer of solid-state phase change material is applied to the first surface of the substrate. A layer of reflective material is positioned at one of a second surface of the substrate, a surface of the solid-state phase change material, and an opposite side of an optical cavity from the substrate.

In another example, a thermal control material includes a substrate patterned on a first surface to form an array of microcones, a layer of solid-state phase change material applied to the array of microcones, and a layer of reflective material applied to a second surface of the substrate.

BRIEF DESCRIPTION OF THE DRAWINGS

The features, objects, and advantages of the invention will become more apparent from the detailed description set forth below when taken in conjunction with the drawings, wherein.

DETAILED DESCRIPTION OF THE INVENTION

Thermal homeostasis is a biological term that describes the process warm-blooded animals use to maintain constant body temperature. All matter at finite temperatures emits electromagnetic radiation due to the thermally induced motion of charges. The spectral characteristics of the radiated power are defined by the emissivity of the surface and the electromagnetic energy density profile. While the emissivity spectrum of a material typically only varies weakly with temperature, radiative thermal control with passive feedback can be achieved by modulating the emissivity as a function of temperature. Existing radiative thermal control schemes require using external power, including fluid-filled heat pipes, mechanically-moving parts, or powered solid-state approaches.

The systems and methods described herein utilize phase-change materials to design an efficient, solid-state alternative based on switchable thermal emission, providing artificial materials that regulate their temperature without external power. In one implementation, this effect is achieved using a multilayered structure comprised of a vanadium dioxide variable emissivity surface, a silicon substrate, and a gold thin film as a back reflector. The thermally-actuated and reversible metal-insulator phase transition in vanadium dioxide provides the passive switching between thermal radiation states in response to external thermal fluctuations. The result is a surface that increases radiative emission above the phase transition temperature (increased cooling at high temperature) and reduces radiative emission below this temperature (increased heat retention at low temperature). Accordingly, the systems and methods described herein demonstrate a thermal control strategy for systems under dynamic thermal loads that are vulnerable to performance degradation or require stable operating temperatures for peak performance.

Figure 1:
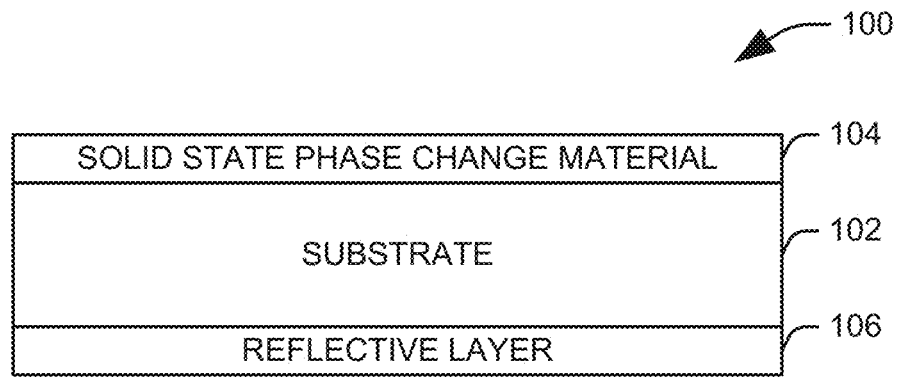
FIG. 1 illustrates an example of a thermal control material having an emissivity that varies as a function of temperature.

FIG. 1 illustrates an example of a thermal control material 100 having an emissivity that varies as a function of temperature. The thermal control material 100 includes a substrate 102 having a first surface and a second surface. The first surface of the substrate can be configured to form one of a photonic crystal, a metamaterial, a multilayer film, and a metasurface. In one implementation, the surface is a substrate patterned to form an array of micro-structures, such as microcones. The substrate can be formed from any appropriate material for forming a photonic metamaterial, and in the illustrated example, a double side polished silicon substrate is used. In one example, the substrate 102 can have a thickness between one hundred and five hundred micrometers.

A layer of solid-state phase change material 104 is applied to the first surface of the substrate 102. The layer of solid state phase change material 104 can have a thickness less than five hundred nanometers, and in one implementation, between fifty and two hundred nanometers. The solid state phase change material 104 can include any material that can transition between two phases in the solid state. Accordingly, the solid state phase change material 104 can include vanadium dioxide, an alloy of vanadium dioxide with a transition metal like tungsten, samarium nickelate, poly(3-hexylthiophene), germanium telluride, germanium-antimony-tellurium, an alloy of germanium with another group 6 element, or any other appropriate phase change material. In practice, the solid state phase material 104 can be selected to have a phase-transition temperature within a desired range associated with individuals or equipment protected by the thermal control material.

A reflective layer 106 is affixed to the second surface of the substrate 102. The reflective layer 106 can be mechanically affixed to the substrate 102 or layered onto the substrate using an appropriate technique, such as sputtering deposition or electron-beam evaporation. The reflective layer 106 can be selected to have high reflectivity in a wavelength band of interest, for example, a reflectivity greater than seventy across the wavelength band of interest. In one example, in which the wavelength band of interest includes at least the infrared spectrum, the reflective material can be gold, silver or other metals that are reflective in the infra-red spectral regime (2 micrometer wavelength to 40 micrometer wavelength). The reflective layer 106 can have a thickness of at least ten nanometers, and in one implementation, the thickness is between fifty and one hundred fifty nanometers.

Figure 2:
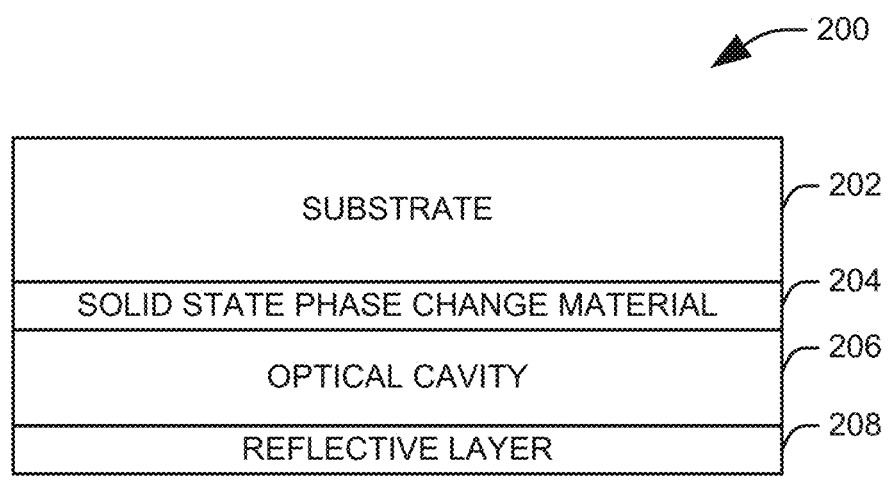
FIG. 2 illustrates an example of a thermal control material having an emissivity that varies as a function of temperature.

FIG. 2 illustrates an example of a thermal control material 200 having an emissivity that varies as a function of temperature. The thermal control material 200 includes a substrate 202 having a first surface and a second surface. The first surface of the substrate can be configured to form one of a photonic crystal, a metamaterial, a multilayer film, and a metasurface. In one implementation, the surface is a substrate patterned to form an array of micro-structures, such as microcones. The substrate can be formed from any appropriate material for forming a photonic metamaterial, and in the illustrated example, a double side polished silicon substrate is used.

A layer of solid-state phase change material 204 is applied to the first surface of the substrate 202. The layer of solid state phase change material 204 can have a thickness less than five hundred nanometers, and in one implementation, between fifty and two hundred nanometers. The solid state phase change material 204 can include any material that can transition between two phases in the solid state. Accordingly, the solid state phase change material 204 can include vanadium dioxide, an alloy of vanadium dioxide with a transition metal, samarium nickelate, poly(3-hexylthiophene), germanium telluride, germanium-antimony-tellurium, an alloy of germanium with another group 6 element, or any other appropriate material for this purpose. In practice, the solid state phase material 204 can be selected to have a phase-transition temperature within a desired range associated with individuals or equipment protected by the thermal control material.

An optical cavity 206, bounded by the solid-state phase change material 204 and a reflective layer 208, can be formed as an air gap or a low dielectric material, such as zinc selenide. In one implementation, the optical cavity 206 can have a thickness on the order of a micron. In another implementation the optical cavity can be designed to be tunable with piezoelectric or micro-electro-mechanical (MEMS)-based implementations. Tuning the length of the cavity would allow tailored spectral control over the emitted thermal radiation.

The reflective layer 208 can be selected to have high reflectivity in a wavelength band of interest, for example, a reflectivity greater than ninety percent across the wavelength band of interest. In one example, in which the wavelength band of interest includes at least the infrared spectrum, the reflective material can be gold. The reflective layer 208 can have a thickness of at least fifty nanometers, and in one implementation, the thickness is between fifty and one hundred fifty nanometers. In one implementation, the reflective layer can be implemented as a gold back side reflective chip located across the optical cavity from the solid-state phase change material 204.

Figure 3:
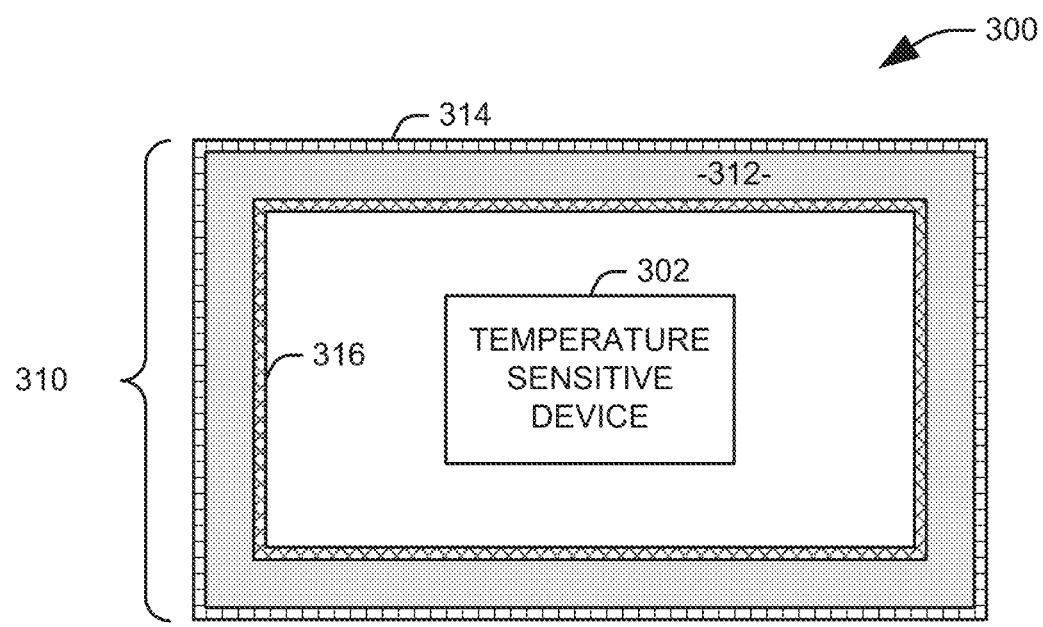
FIG. 3 illustrates a system in which a temperature sensitive object is protected by a thermal control material that is in thermal communication with the object.

FIG. 3 illustrates a system 300 in which a temperature sensitive object 302 is protected by a thermal control material 310 that is in thermal communication with the object. By "thermal communication", it is meant that heat can flow from the object 302 to the thermal control material either via conduction or radiation. Accordingly, while FIG. 3 illustrates the temperature sensitive object 302 as completely encapsulated by the thermal control material 310, in practice, the thermal control material 310 can be in direct contact with the object 302, only partially enclosing the temperature sensitive object, or linked to the object via a thermally conductive material. It will be appreciated that the temperature sensitive object can be any living or non-living thing that is adversely affected by extreme temperatures. In one implementation, each of the temperature sensitive object 302 and the thermal control material 310 are implemented on a spacecraft, and the thermal control material can protect the temperature sensitive object from time-varying heat flux due to solar illumination or to keep an onboard heat load at a targeted operating temperature.

In the illustrated implementation, the thermal control material 310 is implemented in a manner identical to that described in FIG. 1. Accordingly, the substrate 312 has a first surface provided as one of a photonic crystal, a metamaterial, a multilayer film, and a metasurface with a solid-state phase change material 314 layered onto the first surface. A second surface of the substrate 312 is affixed to a reflective layer 316 suitable for a wavelength band of interest. In practice, the wavelength band of interest can range from four hundred nanometers to thirty microns or be configured to exclude the visible spectrum and range from seven-hundred nanometers to thirty microns. In other implementations, the wavelength band of interest can be selected to include one or more of the near, mid, and far infrared ranges. In another implementation, the thermal control material described in FIG. 2 could be used in place of the illustrated thermal control material 310.

The thermal control material 310 provides a state of thermal homeostasis for the system 300. Ideally, the thermal control material 310 would have with near-zero thermal emissivity below a particular temperature, and close-to-unity thermal emissivity above that temperature. As a result, fluctuations in temperature will be mitigated by emissivity change. When the object gets too cold, heat loss to the environment is prevented, and when it gets too hot, heat loss is enhanced. To this end, the solid state phase change material 314 can be selected as a material that transitions between a dielectric state, during which the thermal control material 310 has a first emissivity, and a metallic state, during which the thermal control material 310 has a second emissivity that is much greater than the first emissivity. In one implementation, the second emissivity exceeds the first emissivity by at least a factor of two.

Figure 4:
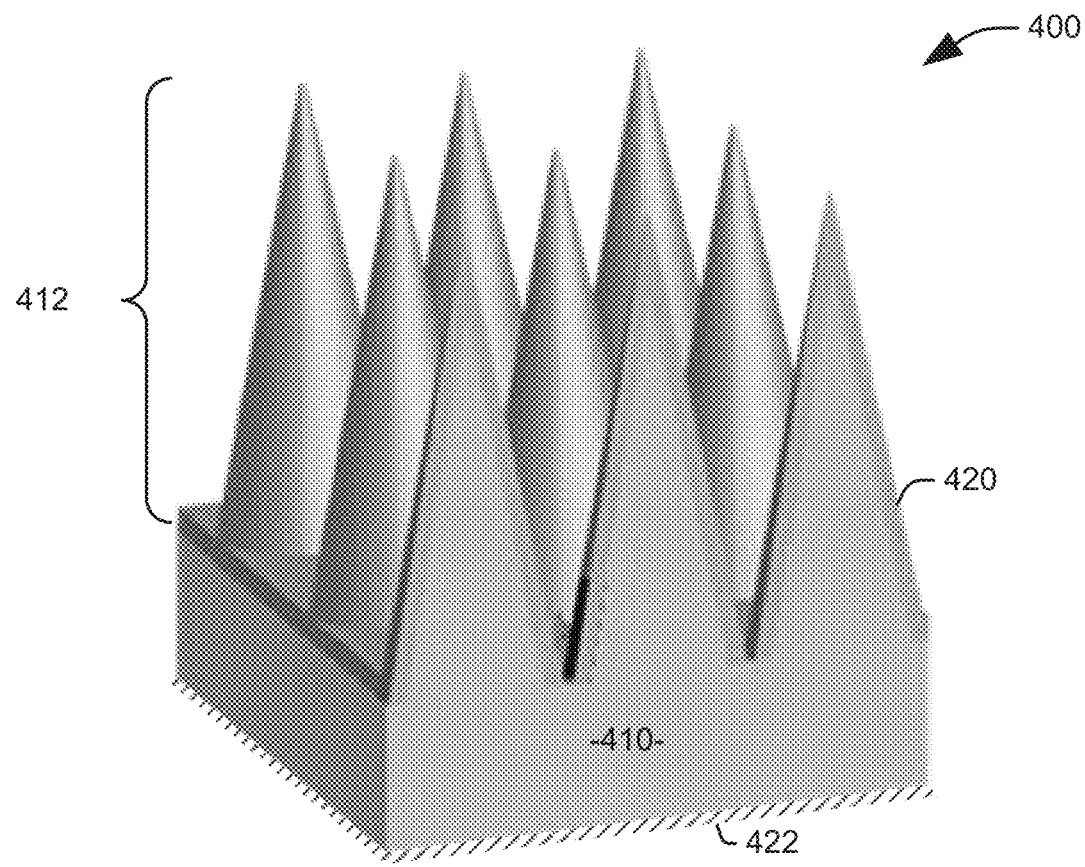
FIG. 4 illustrates one implementation of a thermal control material utilizing a patterned microstructure.

FIG. 4 illustrates one implementation of a thermal control material 400 utilizing a patterned microstructure. In the illustrated implementation, a silicon substrate 410 is patterned to provide square array of microcones 412. The microcone array 412 exhibits strong anti-reflection properties and is relatively insensitive to the angle of incidence of radiation. The array of silicon microcones 412 is covered by a conformal layer of vanadium dioxide 420. A surface of the substrate 410 opposite the array of microcones 412 is layered with gold 422 to provide a reflective layer suitable for the infrared band. In the configuration shown, the array of microcones 412 can have a height between ten and one-hundred micrometers and a period between five and fifty micrometers, the layer of vanadium dioxide 420 can have a thickness less than five hundred nanometers, and the layer of gold 422 can have a thickness between fifty and one-hundred fifty nanometers. In one implementation, the height of the array of silicon microcones 412 can be forty micrometers, the period can be twenty micrometers, and the thickness of the layer of vanadium dioxide can be up to two hundred nanometers. In this implementation, the illustrated thermal control material 400 maintains a temperature that varies by less than twenty kelvin when the thermal control material is subjected to a time-varying illumination fluctuating between one hundred fifty watts per square meter and five hundred watts per square meter.

In the example implementation, including the modeling performed in FIGS. 5 and 6, below, the thickness of the layer of vanadium dioxide 420 was selected to be two hundred nanometers. Improved performance may be possible using a thinner layer of vanadium dioxide 420. When the vanadium dioxide is in an insulating state, the radiated power increases with increasing thickness. In its insulating state, vanadium dioxide is optically absorptive in the infrared range. As the amount of vanadium dioxide increases, the emissivity is increased at wavelengths where silicon is transparent. As the thickness of the layer of vanadium dioxide 420 is increased above one micrometer, the power radiated in the insulating state sharply rose, increasing to a point well above that of the metallic state for increased thicknesses. Accordingly, a very thin layer of vanadium dioxide 420 may be sufficient to provide a maximum emissivity difference between metallic and insulating states when conformally coated on the microcone array 412. For a flat, silicon film coated with a layer of vanadium dioxide, the difference in the radiated power in the metallic and insulating states is maximized when the thickness of layer of vanadium dioxide is thirty nanometers, and a similar value may provide improved performance for the microcone array.

The illustrated thermal control material 400 provides a light-weight, all solid-state thermal control mechanism useful for space applications. The use of mechanically static structures, free of any moving parts, provides a complementary alternative to existing, MEMS-based approaches for thermal emission control. The design is amenable to standard microfabrication techniques. The array of silicon microcones 412, with the dimensions given above, can be fabricated by cryogenic, inductively-coupled plasma reactive-ion etching. The conformal layer of vanadium dioxide 420 can be provided using gas-phase reactions and deposition, such as sputtering deposition, pulsed laser deposition, and atomic layer deposition.

Figure 5:
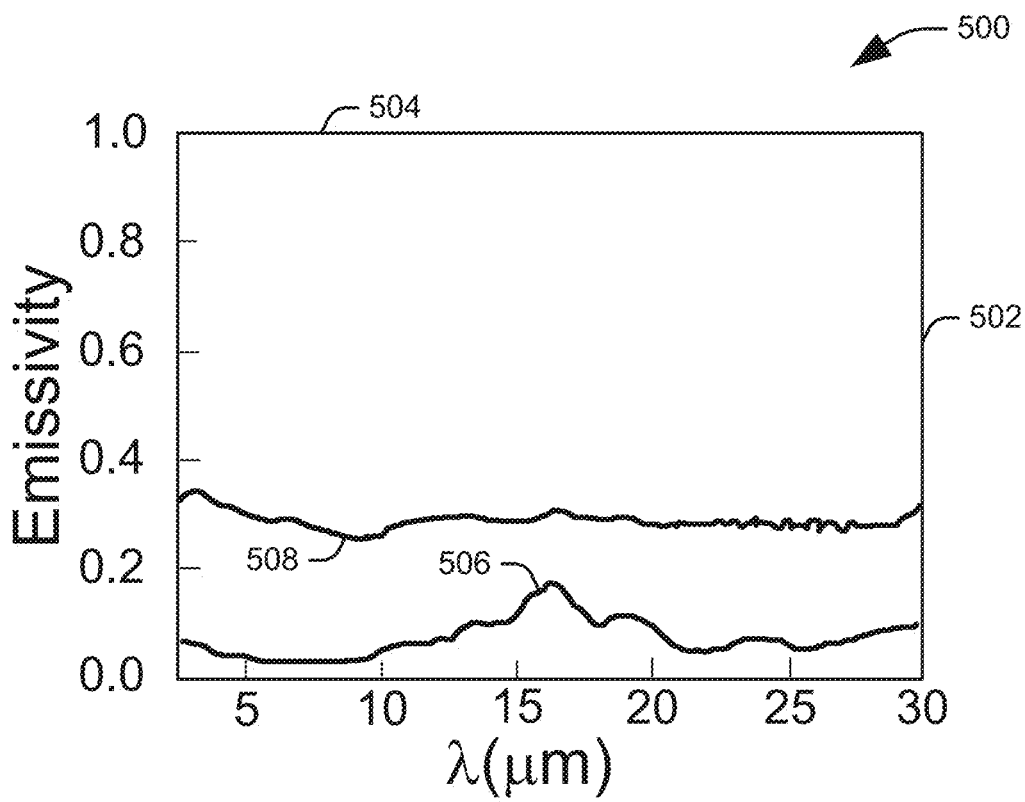
FIG. 5 is a line chart of calculated emissivity spectra of one example of the thermal control material illustrated in FIG. 1 for the two phases of the vanadium dioxide.

FIG. 5 is a line chart 500 of calculated emissivity spectra of one example of the thermal control material illustrated in FIG. 1 for the two phases of the vanadium dioxide. In the example of FIG. 5, the substrate 102 is a two hundred micrometer layer of silicon, the solid-state phase change material 104 is a sixty-two nanometer layer of vanadium dioxide, and the reflective layer 106 is a sixty-three nanometer layer of gold. A vertical axis 502 represents emissivity, and a horizontal axis 504 represents wavelength in micrometers. A first plotted line 506 represents the emissivity of the thermal control material when the vanadium dioxide is in its insulating state. It will be appreciated that the emissivity remains low throughout the wavelength band of interest. A second plotted line 508 represents the emissivity of the thermal control material when the vanadium dioxide is in its metallic state. In the metallic state, the emissivity remains relatively high throughout the wavelength band of interest, with the difference in emissivity between the two states remaining substantial across the wavelengths of interest.

The higher emissivity in the metallic state is associated with a higher value of the imaginary part of the permittivity. The thermal control material thus acts as a switchable thermal emitter, with a difference of nearly a factor of ten in emission between the insulating and metallic states. The oscillatory features in the emissivity are due to reflection from the backside of the material, resulting from the negligibly small absorption in the silicon.

Figure 6:
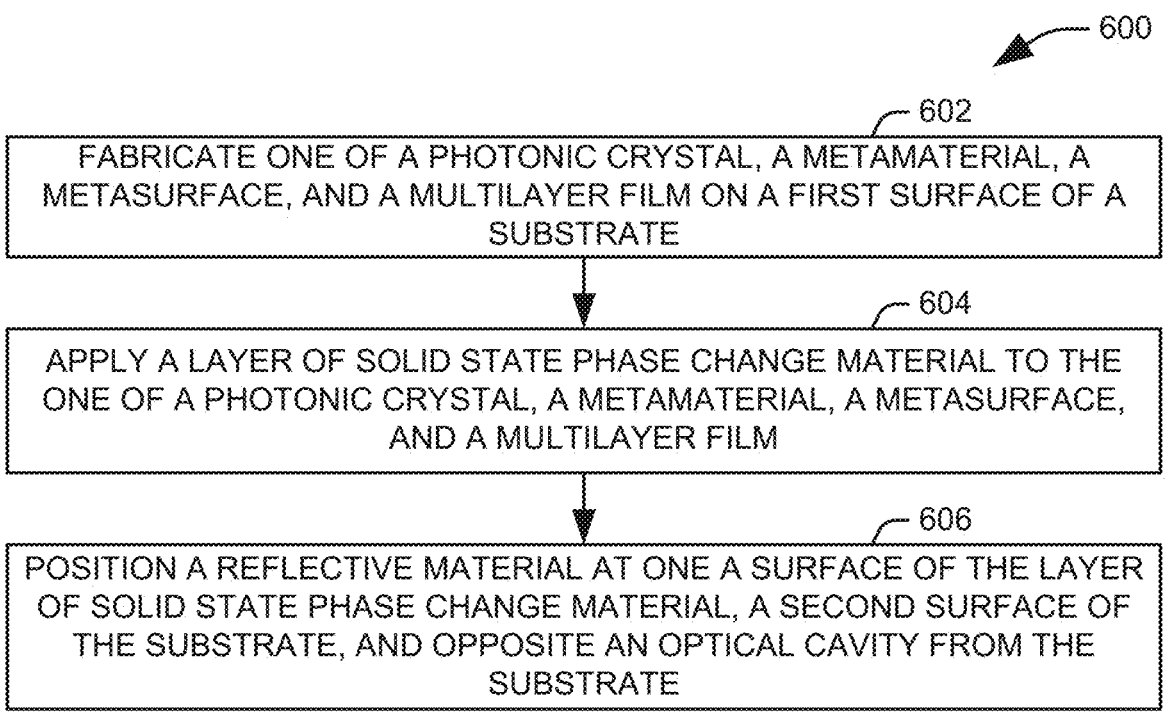
FIG. 6 illustrates a method for providing a thermal control material.

In view of the foregoing structural and functional features described above, an example method will be better appreciated with reference to FIG. 6. While, for purposes of simplicity of explanation, the example method of FIG. 6 is shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method.

FIG. 6 illustrates a method 600 for providing a thermal control material. At 602, one of a photonic crystal, a metamaterial, a metasurface, and a multilayer film is fabricated on a first surface of a substrate. The can include etching the substrate, for example, to provide a microstructure, like an array of microcones, or fabricating a lithographically patterned or a lithographically grown feature on the substrate, for example, to provide a photonic metamaterial. In one implementation, the wavelength range of interest is between 10 nm and 30 µm. In another implementation, the wavelength range of interest is between 700 nm and 15 µm.

At 604, a layer of solid state phase change material is conformally applied to the one of a photonic crystal, a metamaterial, a metasurface, and a multilayer film. For example, the solid state phase change material can be applied using gas-phase reactions and deposition, such as sputtering deposition, pulsed laser deposition, and atomic layer deposition. At 606, a layer of reflective material is positioned at either a second surface of the substrate, a surface of the solid-state phase change material, or an opposite side of an optical cavity from the substrate. For example, the layer of reflective material can be applied using gas-phase reactions and deposition, such as sputtering deposition, pulsed laser deposition, and atomic layer deposition, or fabricated separately and mechanically affixed to the substrate or solid state phase change material. Once the thermal control material is provided, a temperature sensitive device can be at least partially enclosed in the substrate, placed in direct contact with the substrate, or connected via a conductive material to protect the device against fluctuations in temperature.

What has been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A system, comprising:
a temperature sensitive object; and
a thermal control material in thermal communication with the temperature sensitive object and having an emissivity that varies as a function of temperature, the thermal control material comprising:
a substrate comprising a first surface comprising one of a photonic crystal, a metamaterial, a metasurface, and a multilayer film;
solid state phase change material in contact with the surface;
an optical cavity formed of zinc selenide; and
a reflective thin film material positioned on an opposite side of the optical cavity from the substrate.

2. The system of claim 1, wherein the surface is a substrate patterned to form an array of microcones.

3. The system of claim 1, wherein the solid-state phase change material is one of vanadium dioxide and an alloy of vanadium dioxide with a transition metal.

4. The system of claim 1, wherein the solid-state phase change material is one of germanium telluride and an alloy of germanium with another group 6 element.

5. The system of claim 1, wherein solid-state phase change material is a layer having a thickness less than five hundred nanometers.

6. The system of claim 1, wherein the solid-state phase change material is selected to have a phase-transition temperature within a desired operating range of the temperature sensitive object.

7. The system of claim 1, wherein the solid-state phase change material can transition between a dielectric state, during which the thermal control material has a first emissivity, and a metallic state, during which the thermal control material has a second emissivity, the second emissivity being at least a factor of two larger than the first emissivity.

8. The system of claim 1, each of the surface and the solid-state phase change material are configured such that a temperature at the temperature sensitive object varies by less than twenty kelvin when the thermal control material is subjected to a time-varying heat flux between one hundred fifty watts per square meter and five hundred watts per square meter.

9. The system of claim 8, wherein each of the temperature sensitive object and the thermal control material are implemented on a spacecraft and the time-varying heat flux is solar illumination.

10. A method for providing a thermal control material, comprising:
fabricating one of a photonic crystal, a metamaterial, a metasurface, and a multilayer film on a first surface of a substrate;
applying a layer of solid-state phase change material to the first surface of the substrate; and
positioning a layer of reflective material on an opposite side of an optical cavity from the substrate, the optical cavity being formed of zinc selenide.

11. The method of claim 10, further comprising at least partially enclosing a temperature sensitive device in the substrate.

12. The method of claim 10, wherein the wavelength range of interest is between ten nanometers and thirty microns.

13. The method of claim 10, wherein fabricating the one of a photonic crystal, a metamaterial, a metasurface, and a multilayer film comprises etching the substrate.

14. The method of claim 13, wherein the etching of the substrate provides an array of microcones.

15. The method of claim 10, wherein fabricating the one of a photonic crystal, a metamaterial, a metasurface, and a multilayer film comprises fabricating one of a lithographically patterned and a lithographically grown feature on the substrate.

16. The method of claim 15, wherein the one of a lithographically patterned and a lithographically grown feature provides a photonic metamaterial.

17. A thermal control material, comprising:
a substrate patterned on a first surface to form an array of microcones;
a layer of solid-state phase change material applied to the array of microcones; and
a layer of reflective material positioned on an opposite side of an optical cavity from the substrate, the optical cavity being formed of zinc selenide.

18. The thermal control material of claim 17, wherein the array of microcones have a height between one and one-hundred micrometers, and a period between five and fifty micrometers.

19. The thermal control material of claim 17, wherein the layer of solid-state phase change material is a conformal layer of vanadium dioxide having a thickness less than five hundred nanometers.

20. A system, comprising:
a temperature sensitive device; and
the thermal control material of claim 17, at least partially enclosing the temperature sensitive device.

* * * * *